United States Patent
Ono et al.

(10) Patent No.: US 10,636,676 B2
(45) Date of Patent: Apr. 28, 2020

(54) HEAT TREATMENT METHOD AND HEAT TREATMENT APPARATUS OF LIGHT IRRADIATION TYPE

(71) Applicant: SCREEN HOLDINGS CO., LTD., Kyoto-shi, Kyoto (JP)

(72) Inventors: Yukio Ono, Kyoto (JP); Kaoru Matsuo, Kyoto (JP); Kazuhiko Fuse, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 66 days.

(21) Appl. No.: 15/882,271

(22) Filed: Jan. 29, 2018

(65) Prior Publication Data
US 2018/0240681 A1 Aug. 23, 2018

(30) Foreign Application Priority Data
Feb. 23, 2017 (JP) .................................. 2017-031804

(51) Int. Cl.
*H01L 21/00* (2006.01)
*H01L 21/324* (2006.01)
(Continued)

(52) U.S. Cl.
CPC ........ *H01L 21/324* (2013.01); *H01J 37/3299* (2013.01); *H01J 37/32724* (2013.01);
(Continued)

(58) Field of Classification Search
CPC . B29C 66/71; B29C 66/7212; B29C 65/1406; B29C 65/1412; B29C 65/1425;
(Continued)

(56) References Cited

U.S. PATENT DOCUMENTS 8,987,123 B2   3/2015  Yamada et al.
2003/0080104 A1* 5/2003 Kusuda .................. C30B 31/14
                                                         219/390
(Continued)

FOREIGN PATENT DOCUMENTS

JP    2005-72291 A    3/2005
JP    2008-028091 A   2/2008
(Continued)

OTHER PUBLICATIONS

Taiwanese Office Action issued in corresponding Taiwanese Patent Application No. 106142879, dated Aug. 31, 2018, with English Translation of the Japanese Translation of the Taiwanese Office Action.

(Continued)

*Primary Examiner* — Robert G Bachner
(74) *Attorney, Agent, or Firm* — McDermott Will & Emery LLP

(57) ABSTRACT

When pressure in a chamber is once reduced lower than that when a flash of light is emitted and is maintained, after a flash lamp irradiates a semiconductor wafer accommodated in the chamber with the flash of light, a portion in the chamber, where gas is liable to remain, is eliminated. Then, when a flow rate of nitrogen gas to be supplied into the chamber is increased to discharge gas in the chamber, particles flying in the chamber due to flash irradiation can be smoothly discharged. As a result, the particles flying in the chamber can be prevented from being attached to an additional semiconductor wafer.

4 Claims, 12 Drawing Sheets

(51) Int. Cl.
*H01J 61/90* (2006.01)
*H01L 21/67* (2006.01)
*H01J 37/32* (2006.01)
*H01L 21/687* (2006.01)
*H01L 21/268* (2006.01)

(52) U.S. Cl.
CPC ........ *H01J 37/32935* (2013.01); *H01J 61/90* (2013.01); *H01L 21/67115* (2013.01); *H01L 21/6875* (2013.01); *H01L 21/68707* (2013.01); *H01L 21/2686* (2013.01)

(58) Field of Classification Search
CPC .............. B29C 65/1435; B29C 65/148; B29C 65/3612; B29C 65/3636; B29C 65/3676; B29C 65/3696; B29C 66/3474; B29C 66/721; B29C 66/72141; B29C 66/72143; B29C 66/73772; B29C 66/73774; B29C 66/73776; B29C 66/73921; B29C 66/91411; B29C 66/91443; B29C 66/91931; B29C 66/91933; B29C 66/91935; B29C 66/91943; B29C 66/91945; B29C 66/91951; H01L 2924/0002; H01L 2924/00; H01L 29/045; H01L 29/0657; H01L 29/2003; H01L 29/34; H01L 33/16; H01L 21/76801; H01L 21/76808; H01L 21/76832; H01L 21/02274

See application file for complete search history.

(56) References Cited

U.S. PATENT DOCUMENTS

| | | |
|---|---|---|
| 2005/0047767 A1 | 3/2005 | Nozaki |
| 2005/0095826 A1 | 5/2005 | Fujita et al. |
| 2008/0017114 A1* | 1/2008 | Watanabe ......... H01L 21/67115 118/725 |
| 2009/0117743 A1* | 5/2009 | Nodera ................. C23C 16/345 438/694 |

FOREIGN PATENT DOCUMENTS

| | | |
|---|---|---|
| JP | 2011-097068 A | 5/2011 |
| JP | 5955604 B2 | 7/2016 |
| KR | 10-2009-0037340 A | 4/2009 |
| TW | 200524052 A | 7/2005 |
| TW | I297512 B | 6/2008 |

OTHER PUBLICATIONS

Korean Office Action issued in corresponding Korean Patent Application No. 10-2018-0006105, dated Jun. 18, 2019, with English translation.

* cited by examiner

F I G . 4
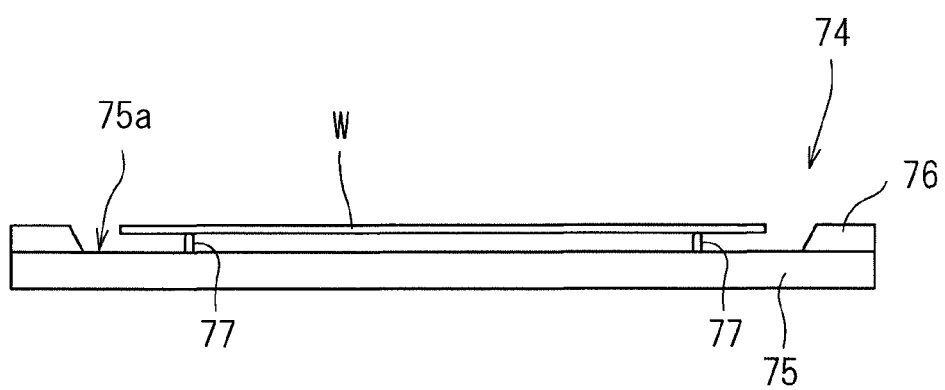

F I G . 6
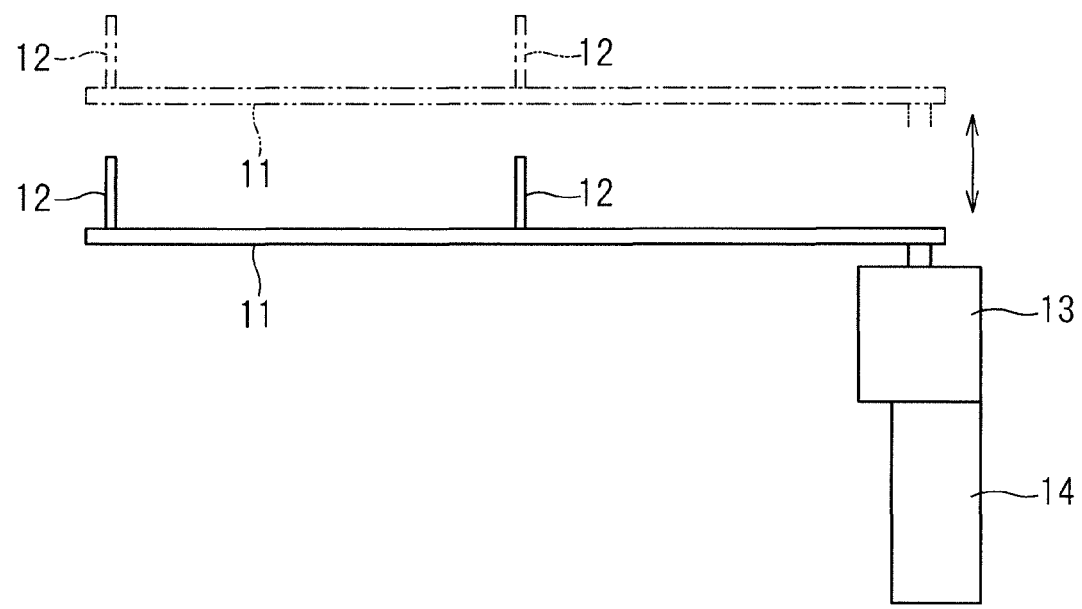

F I G . 8
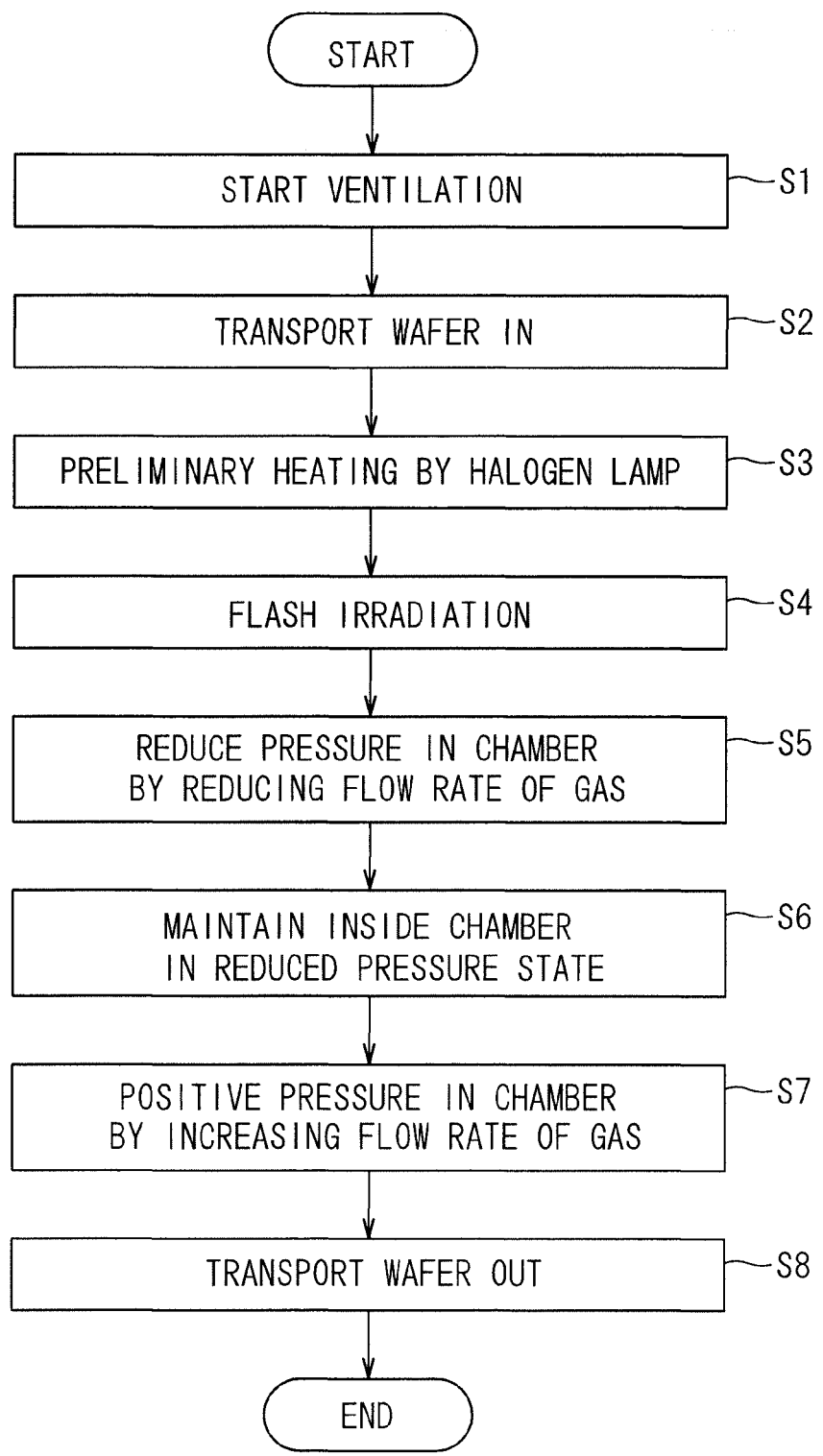

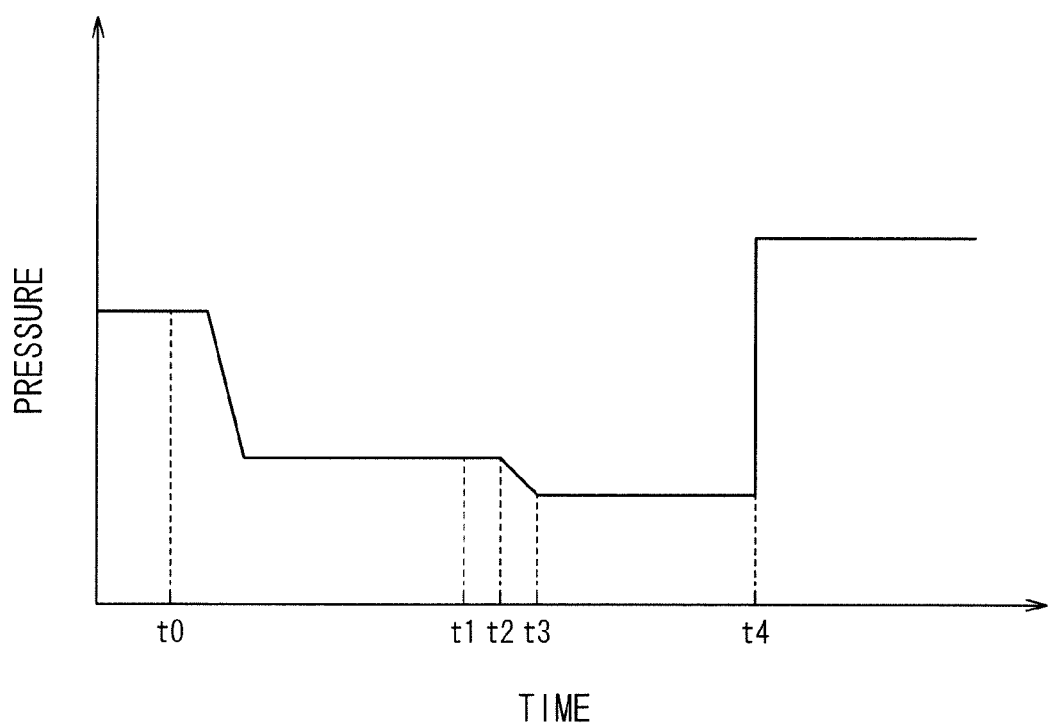
F I G . 1 2

HEAT TREATMENT METHOD AND HEAT TREATMENT APPARATUS OF LIGHT IRRADIATION TYPE

BACKGROUND OF THE INVENTION

Field of the invention

The present invention relates to a heat treatment method and a heat treatment apparatus, for irradiating a thin-plated precision electronic substrate (hereinafter referred to as simply "substrate") such as a semiconductor wafer with a flash of light to heat the substrate.

Description of the Background Art

In a manufacturing process of semiconductor devices, flash lamp annealing (FLA) for heating a semiconductor wafer for an extremely short time has been paid attention. The flash lamp annealing is a heat treatment technology for irradiating a surface of a semiconductor wafer with a flash of light by using a xenon flash lamp (hereinafter when referred to as simply a "flash lamp", it means a xenon flash lamp) to increase temperature of only the surface of the semiconductor wafer in an extremely short time (milliseconds or less).

The xenon flash lamp has an emission spectroscopy distribution radiation from an ultraviolet part to a near-infrared part, and has a wave length that is shorter than that of a conventional halogen lamp, and that almost coincides with that of a fundamental absorption band of a semiconductor wafer made of silicon. This causes transmitted light to decrease when the xenon flash lamp irradiates a semiconductor wafer with a flash of light, so that temperature of the semiconductor wafer can be rapidly increased. It is also found that flash irradiation for an extremely short time of milliseconds or less enables only near a surface of a semiconductor wafer to be selectively increased in temperature.

This kind of flash lamp annealing is used for treatment requiring heating for an extremely short time, such as typically activation of impurities implanted into a semiconductor wafer. When a flash lamp irradiates a surface of a semiconductor wafer, into which impurities are implanted by an ion implantation method, with a flash of light, temperature of the surface of the semiconductor wafer can be increased to an activation temperature for only an extremely short time, whereby only impurity activation can be performed without diffusing the impurities deeply.

A flash lamp emits a flash of light that is an optical pulse with an extremely short irradiation time and high intensity, so that when the flash of light is emitted, a structure and a gas in a chamber in which a semiconductor wafer is accommodated are rapidly heated to cause instantaneous gas expansion followed by shrinkage. As a result, particles curl up and fly in the chamber. US2005/0047767 discloses a technique of intentionally irradiating an empty chamber in which no semiconductor wafer is accommodated with a flash of light multiple times to cause particles to fly in the chamber by using the above-mentioned phenomenon when a flash of light is emitted, and then forming a flow of nitrogen gas in the chamber to discharge the particles to the outside of the chamber.

Unfortunately, the phenomenon, in which particles curl up in a chamber when a flash of light is emitted, also occurs when flash heating is applied to a semiconductor wafer to be treated. When particles as described above are attached to a surface of a semiconductor wafer, the particles cause a problem in that the semiconductor wafer is contaminated.

SUMMARY OF THE INVENTION

The present invention intends for a heat treatment method for irradiating a substrate with a flash of light to heat the substrate.

In an aspect of the present invention, the heat treatment method includes the following steps of: (a) irradiating a surface of a substrate accommodated in a chamber with a flash of light from a flash lamp; (b) maintaining pressure in the chamber lower than that in the step (a) after the step (a); and (c) increasing a flow rate of an inert gas to be supplied into the chamber after the step (b), and discharging a gas in the chamber.

A flow rate of an inert gas to be supplied into a chamber is increased after a portion of chamber where gas is liable to remain is eliminated, so that particles flying in the chamber can be prevented from attaching to a substrate by being smoothly discharged.

The present invention also intends for a heat treatment apparatus for irradiating a substrate with a flash of light to heat the substrate.

In an aspect of the present invention, the heat treatment apparatus includes the following: a chamber that accommodates a substrate; a holder that holds the substrate in the chamber; a flash lamp that irradiates a surface of the substrate held by the holder with a flash of light; a gas supplying unit that supplies an inert gas into the chamber; an exhaust unit that discharges a gas in the chamber; and a pressure control valve that is provided between the chamber and the exhaust unit to control pressure in the chamber, wherein after the flash lamp irradiates the substrate with the flash of light, the pressure control valve maintains pressure in the chamber lower than that when the flash of light is emitted and then the gas supplying unit increases a flow rate of the inert gas to be supplied into the chamber, and the exhaust unit discharges the gas in the chamber.

A flow rate of an inert gas to be supplied into a chamber is increased after a portion of chamber where gas is liable to remain is eliminated, so that particles flying in the chamber can be prevented from attaching to a substrate by being smoothly discharged.

Thus, it is an object of the present invention to prevent particles flying in a chamber from attaching to a substrate.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a sectional view of the susceptor;

FIG. 6 is a side view of the transfer mechanism;

FIG. 8 is a flowchart illustrating a treatment procedure for a semiconductor wafer in the heat treatment apparatus of FIG. 1;

FIG. 12 illustrates pressure change in a chamber in the second preferred embodiment.

DESCRIPTION OF THE PREFERRED EMBODIMENTS

Hereinafter, embodiments of the present invention will be described in detail with reference to drawings.

<First Preferred Embodiment>

Figure 1:
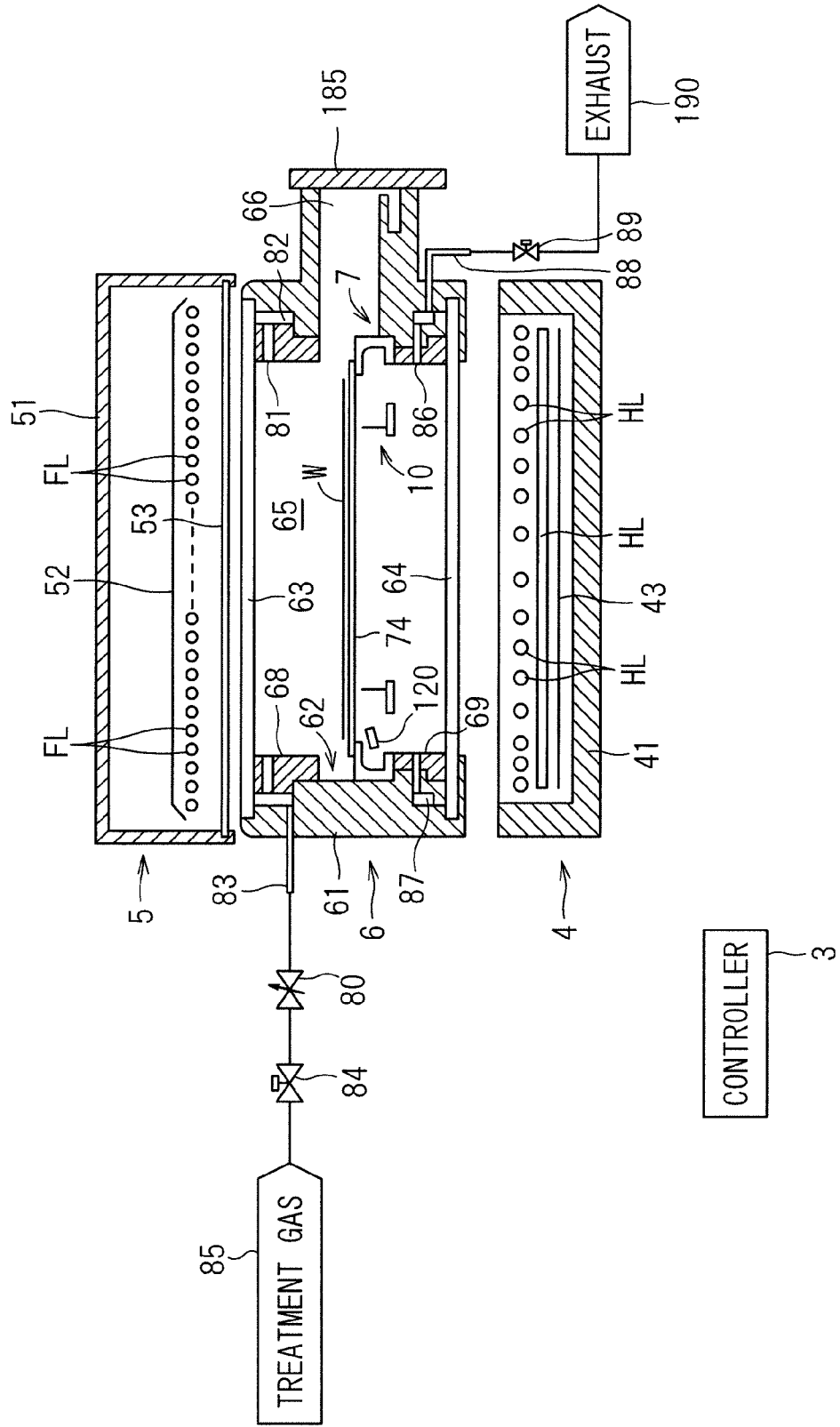
FIG. 1 is a longitudinal sectional view illustrating a structure of a heat treatment apparatus according to the present invention.

FIG. 1 is a longitudinal sectional view illustrating structure of a heat treatment apparatus 1 according to the present invention. The heat treatment apparatus 1 of the present preferred embodiment is a flash lamp annealer that irradiates a semiconductor wafer W in the shape of a disk, as a substrate, with a flash of light to heat the semiconductor wafer W. While a size of the semiconductor wafer W to be treated is not particularly limited, the semiconductor wafer W to be treated has a diameter of 300 mm or 450 mm, for example (300 mm in the present preferred embodiment). Impurities are implanted into a semiconductor wafer W before fed into the heat treatment apparatus 1, and activation treatment for the implanted impurities is performed by heating treatment by the heat treatment apparatus 1. In FIG. 1 and the subsequent drawings, dimensions of components and the number of components are illustrated while being exaggerated or simplified, as appropriate, for easy understanding.

The heat treatment apparatus 1 includes a chamber 6 that accommodates a semiconductor wafer W, a flash heating unit 5 having a plurality of built-in flash lamps FL, and a halogen heating unit 4 having a plurality of built-in halogen lamps HL. The flash heating unit 5 is provided over the chamber 6, and the halogen heating unit 4 is provided under the chamber 6. The heat treatment apparatus 1 further includes a holder 7 provided inside the chamber 6 and for holding a semiconductor wafer W in a horizontal posture, and a transfer mechanism 10 provided inside the chamber 6 and for transferring a semiconductor wafer W between the holder 7 and the outside of the heat treatment apparatus 1. The heat treatment apparatus 1 further includes a controller 3 that controls an operating mechanism provided in each of the halogen heating unit 4, the flash heating unit 5, and the chamber 6 to apply heat treatment to a semiconductor wafer W.

The chamber 6 includes a tubular chamber side portion 61, and chamber windows made of quartz mounted on the top and bottom of the chamber side portion 61. The chamber side portion 61 has a substantially tubular shape with an open top and an open bottom. The upper chamber window 63 is mounted to block the open top of the chamber side portion 61, and the lower chamber window 64 is mounted to block the open bottom thereof. The upper chamber window 63 forming the ceiling of the chamber 6 is a disk-shaped member made of quartz, and serves as a quartz window that transmits flashes of light emitted from the flash heating unit 5 therethrough into the chamber 6. The lower chamber window 64 forming the floor of the chamber 6 is also a disk-shaped member made of quartz, and serves as a quartz window that transmits light emitted from the halogen heating unit 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws (not illustrated). In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65. In the present preferred embodiment, the heat treatment space 65 in the chamber 6 has a volume of 30 liters.

A recessed portion 62 is defined in the inner wall surface of the chamber 6 by mounting the upper and lower reflective rings 68 and 69 to the chamber side portion 61. Specifically, there is defined the recessed portion 62 surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 that holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (nitrogen gas ($N_2$) in the present preferred embodiment) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a gas supply source 85. A valve 84 and a flow regulating valve 80 are provided at some midpoint in the gas supply pipe 83. When the valve 84 is opened, the treatment gas is fed from the gas supply source 85 to the buffer space 82. The flow regulating valve 80 adjusts a flow rate of the treatment gas flowing through the gas supply pipe 83. The treatment gas flowing into the buffer space 82 flows in a spreading manner within the buffer space 82 that is lower in fluid resistance than the gas supply opening 81, and is supplied through the gas supply opening 81 into the heat treatment space 65. The gas supply source 85, the gas supply pipe 83, the valve 84, and the flow regulating valve 80 constitute a gas supplying unit. The treatment gas is not limited to nitrogen gas, and may be an inert gas such as argon (Ar) and helium (He), or a reactive gas such as oxygen ($O_2$), hydrogen ($H_2$), chlorine ($Cl_2$), hydrogen chloride (HCl), ozone ($O_3$), and ammonia ($NH_3$).

Meanwhile, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust unit 190. A pressure control valve 89 is provided at some midpoint in the gas exhaust pipe 88. When the pressure control valve 89 is opened, the gas in the heat treatment space 65 is discharged through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, provided in a circumferential direction of the chamber 6, and each may be in the form of a slit.

As the exhaust unit 190, there are available a vacuum pump and a utility exhaust system of a factory in which the heat treatment apparatus 1 is installed. When a vacuum pump is employed as the exhaust unit 190 to exhaust the atmosphere provided in the heat treatment space 65 that is an enclosed space while no gas is supplied from the gas supply opening 81 by closing the valve 84, the atmosphere provided in the chamber 6 can be reduced in pressure to a vacuum atmosphere. Even when the vacuum pump is not used as the exhaust part 190, the pressure of the atmosphere provided in the chamber 6 can be reduced to a pressure lower than atmospheric pressure by exhausting the atmosphere provided in the heat treatment space 65 while the gas is not supplied from the gas supply opening 81. The pressure control valve 89 provided between the chamber 6 and the exhaust unit 190 is capable of controlling pressure in the chamber 6 by adjusting an exhaust flow rate on the basis of a measurement value of a pressure sensor (not illustrated) for measuring pressure in the chamber 6 such that the pressure becomes a setting value.

Figure 2:
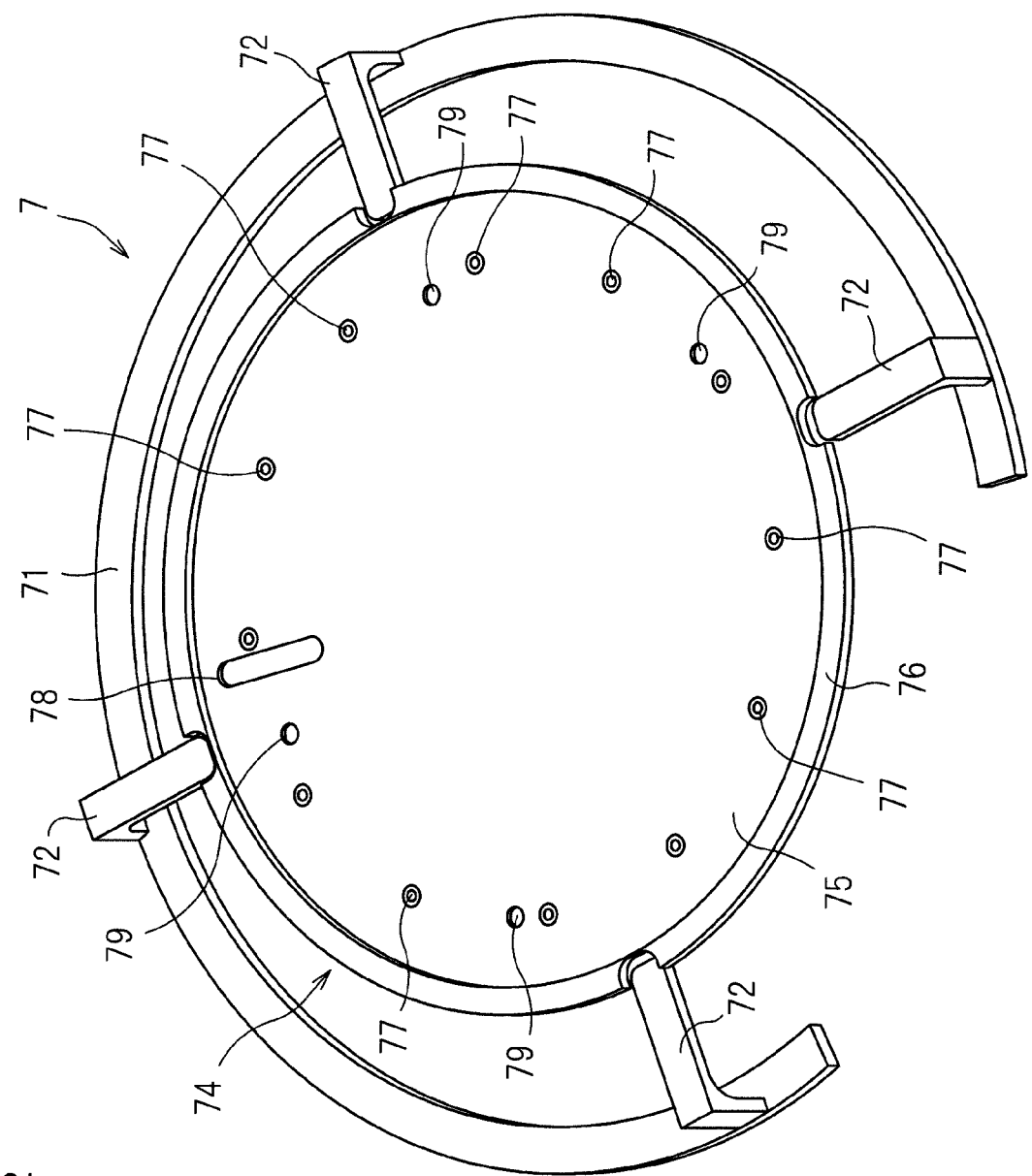
FIG. 2 is a perspective view illustrating the entire external appearance of a holder.

FIG. 2 is a perspective view illustrating the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (refer to FIG. 1). The multiple coupling portions 72 (in the present preferred embodiment, four coupling portions 72) are mounted upright on the upper surface of the base ring 71 and provided in a circumferential direction of the annular shape thereof. The coupling portions 72 are also quartz members, and are rigidly secured to the base ring 71 by welding.

Figure 3:
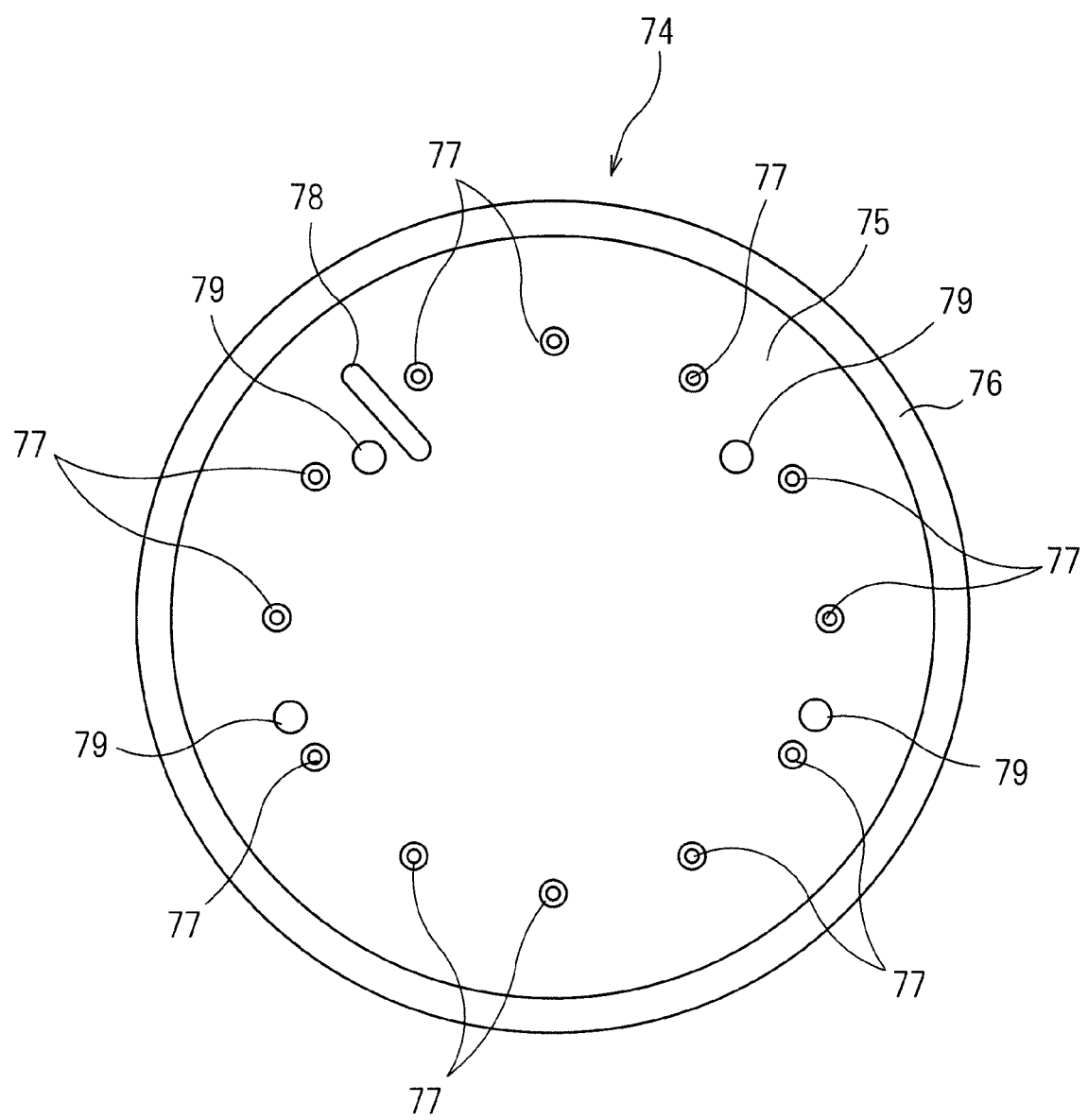
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a substantially circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface that becomes wider upward from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75, inside the guide ring 76, serves as a planar holding surface 75a for holding the semiconductor wafer W. The substrate support pins 77 are provided upright on the holding surface 75a of the holding plate 75. In the present preferred embodiment, a total of 12 substrate support pins 77 are provided upright at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 mm to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. In a state where the holder 7 is mounted to the chamber 6, the holding plate 75 of the susceptor 74 has a horizontal posture (a posture in which the normal to the susceptor 74 coincides with a vertical direction). In other words, the holding surface 75a of the holding plate 75 becomes a horizontal surface.

A semiconductor wafer W transported into the chamber 6 is placed and held in a horizontal posture on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W can be supported in a horizontal posture by the 12 substrate support pins 77 because the 12 substrate support pins 77 each have a uniform height (distance from the upper end of the substrate support pin 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As illustrated in FIGS. 2 and 3, an opening 78 is provided in the holding plate 75 of the susceptor 74 so as to extend vertically through the holding plate 75 of the susceptor 74. The opening 78 is provided for a radiation thermometer 120 (refer to FIG. 1) to receive radiation (infrared radiation) emitted from the lower surface of the semiconductor wafer W held by the susceptor 74. Specifically, the radiation thermometer 120 receives the radiation emitted from the lower surface of the semiconductor wafer W held by the susceptor 74 through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the respective through holes 79 to transfer a semiconductor wafer W.

Figure 5:
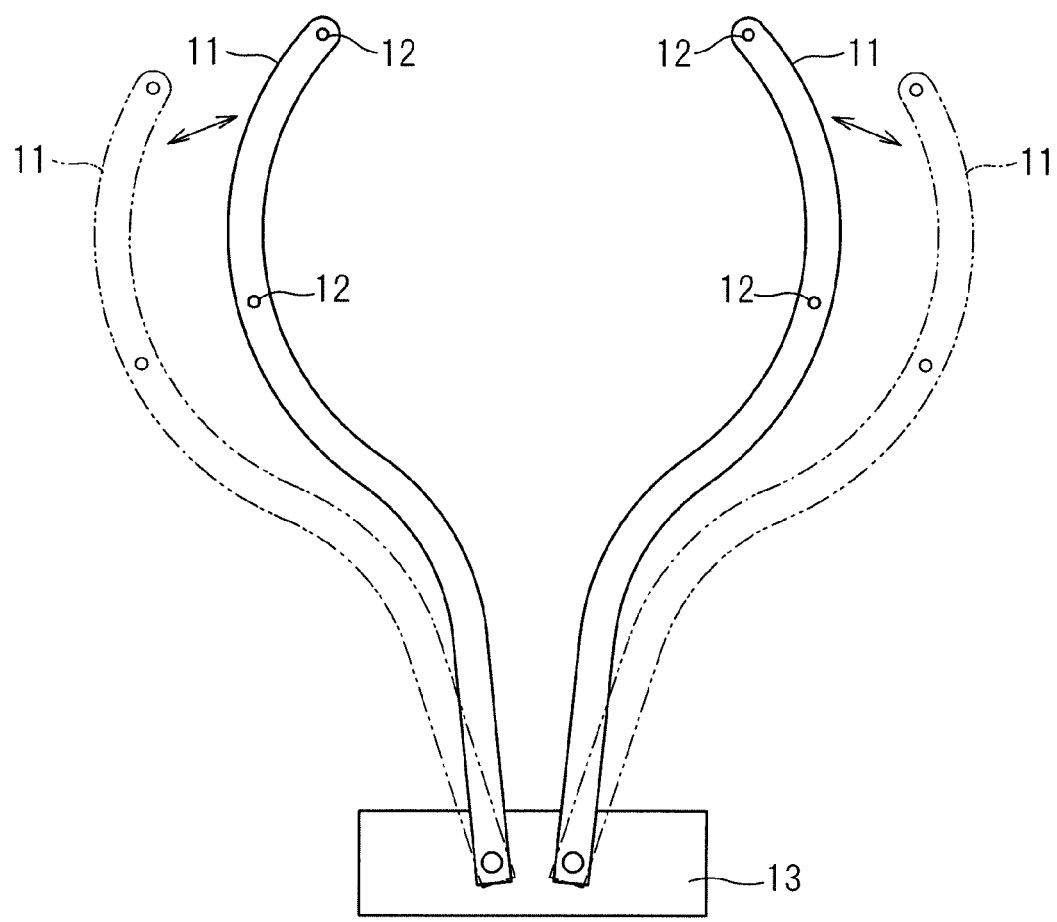
FIG. 5 is a plan view of a transfer mechanism.

FIG. 5 is a plan view of the transfer mechanism 10. FIG. 6 is a side view of the transfer mechanism 10. The transfer mechanism 10 includes the two transfer arms 11. The transfer arms 11 each are in an arcuate shape extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type that causes individual motors to pivot the respective transfer arms 11, or may be of the type which uses a linkage mechanism to cause a single motor to pivot the pair of transfer arms 11 in cooperative relation.

The transfer arms 11 are moved up and down together with the horizontal movement mechanism 13 by a lifting mechanism 14. When the lifting mechanism 14 moves up the pair of transfer arms 11 at their transfer operation position, the four lift pins 12 in total pass through the respective four through holes 79 (refer to FIGS. 2 and 3) bored in the susceptor 74 so that the upper ends of the lift pins 12 protrude from the upper surface of the susceptor 74. Meanwhile, when the lifting mechanism 14 moves down the pair of transfer arms 11 at their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62.

Referring again to FIG. 1, the flash heating unit 5 provided over the chamber 6 includes a housing 51, a light source provided inside the housing 51, being composed of the multiple (in the present preferred embodiment, 30) xenon flash lamps FL, and a reflector 52 provided inside the housing 51 so as to cover the light source from above. The flash heating unit 5 further includes a lamp light radiation window 53 mounted to the bottom of the housing 51. The lamp light radiation window 53 forming the floor of the flash heating unit 5 is a plate-like quartz window made of quartz. The flash heating unit 5 is provided over the chamber 6, whereby the lamp light radiation window 53 is opposed to the upper chamber window 63. The flash lamps FL each irradiate the heat treatment space 65 with a flash of light from over the chamber 6 through the lamp light radiation window 53 and the upper chamber window 63.

The flash lamps FL, each of which is a rod-shaped lamp having an elongated cylindrical shape, are arranged in a plane such that the flash lamps FL are parallel to each other in their longitudinal directions, along a main surface of a semiconductor wafer W held by the holder 7 (or along a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes provided on opposite ends thereof, the electrodes being connected to a capacitor, and a trigger electrode attached to the outer peripheral surface of the glass tube. A xenon gas is electrically insulated, so that no electricity flows in the glass tube in a normal state even if electric charges are accumulated in the capacitor. However, when high voltage is applied to the trigger electrode to produce an electrical breakdown, electricity accumulated in the capacitor flows momentarily in the glass tube, and then xenon atoms or molecules are excited to cause light emission. In the xenon flash lamp FL as described above, electrostatic energy preliminarily accumulated in the capacitor is converted into an extremely short optical pulse of 0.1 milliseconds to 100 milliseconds, so that it has a feature capable of emitting extremely intensive light as compared with a light source of continuous lighting like the halogen lamp HL. In other words, the flash lamp FL is a pulse light emission lamp that emits light in an extremely short time of less than one second. The flash lamp FL has a light emission time that can be adjusted by changing a coil constant of a lamp power source that supplies electric power to the flash lamp FL.

The reflector 52 is provided over the plurality of flash lamps FL so as to cover all of the flash lamps FL. The reflector 52 has a fundamental function of reflecting flashes of light emitted from the plurality of flash lamps FL toward the heat treatment space 65. The reflector 52 is a plate made of an aluminum alloy, and has a surface (a surface facing the flash lamps FL) that is roughened by abrasive blasting.

The halogen heating unit 4 provided under the chamber 6 includes a housing 41 incorporating the multiple (in the present preferred embodiment, 40) halogen lamps HL. The halogen heating unit 4 is a light irradiator that irradiates the heat treatment space 65 with light from under the chamber 6 through the lower chamber window 64 to heat the semiconductor wafer W by the halogen lamps HL.

Figure 7:
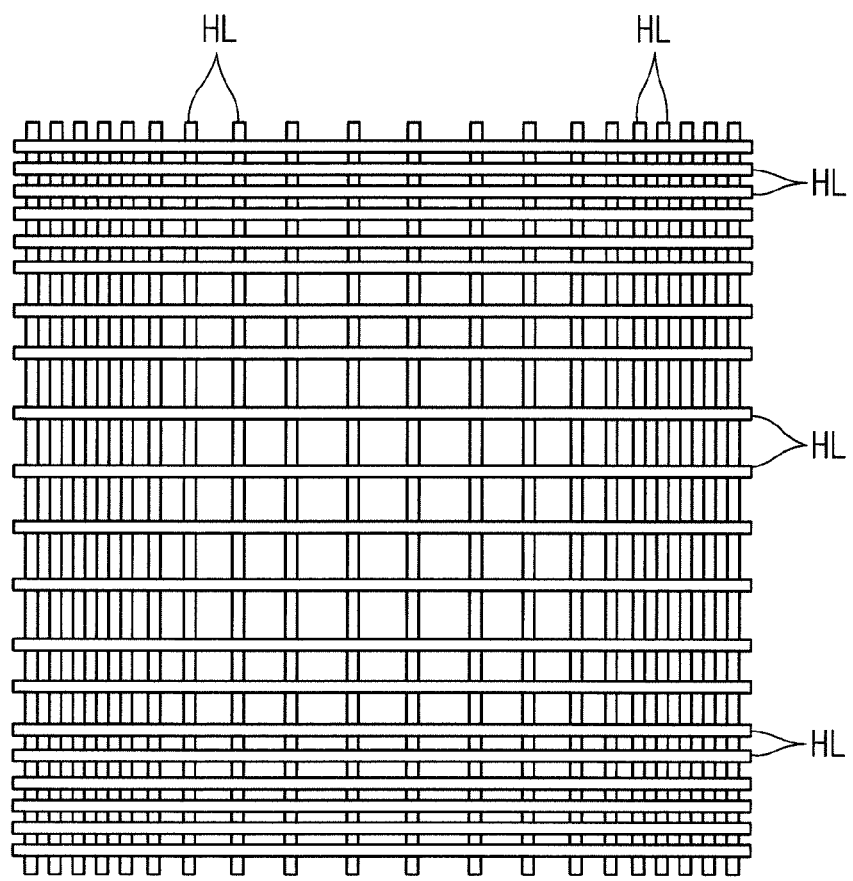
FIG. 7 is a plan view illustrating a placement of halogen lamps.

FIG. 7 is a plan view illustrating a placement of the multiple halogen lamps HL. The 40 halogen lamps HL are disposed in two tiers, i.e. upper and lower tiers. That is, 20 halogen lamps HL are disposed in the upper tier closer to the holder 7, and 20 halogen lamps HL are disposed in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so as to be parallel to each other in their longitudinal directions along a main surface of a semiconductor wafer W held by the holder 7 (or along a horizontal direction). Thus, a plane defined by the arrangement of the halogen lamps HL in each of the upper and lower tiers is also a horizontal plane.

As illustrated in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating unit 4.

The group of halogen lamps HL in the upper tier and the group of halogen lamps HL in the lower tier are arranged to intersect each other in a lattice pattern. In other words, the 40 halogen lamps HL in total are disposed such that the 20 halogen lamps HL arranged in the upper tier and the 20 halogen lamps HL arranged in the lower tier are orthogonal to each other in their longitudinal directions.

Each of the halogen lamps HL is a filament-type light source that passes current through a filament disposed in a glass tube to make the filament incandescent, thereby emitting light. A gas prepared by injecting a halogen element (iodine, bromine, and the like) in trace amounts into an inert gas such as nitrogen, argon, and the like is sealed in the glass tube. The injection of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the housing 41 of the halogen heating unit 4 under the halogen lamps HL arranged in two tiers (refer to FIG. 1). The reflector 43 reflects light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data, and the like therein. The CPU in the controller 3 executes a predetermined processing program, whereby processing in the heat treatment apparatus 1 proceeds.

The heat treatment apparatus 1 further includes, in addition to the aforementioned components, various cooling structures to prevent an excessive temperature rise in the halogen heating unit 4, the flash heating unit 5, and the chamber 6 because of the heat energy generated from the halogen lamps HL and the flash lamps FL during the heat treatment of a semiconductor wafer W. As an example, a water cooling tube (not illustrated) is provided in the walls of the chamber 6. In addition, the halogen heating unit 4 and the flash heating unit 5 have an air cooling structure for forming a gas flow therein to exhaust heat. Air is supplied to a gap between the upper chamber window 63 and the lamp light radiation window 53 to cool down the flash heating unit 5 and the upper chamber window 63.

Subsequently, a treatment procedure for a semiconductor wafer W in the heat treatment apparatus 1 will be described. The semiconductor wafer W to be treated is a semiconductor substrate made of silicon, having a surface to which impurities (ions) are added by an ion implantation method. The impurities are activated by heating treatment (annealing) by flash irradiation, performed by the heat treatment apparatus 1. FIG. 8 is a flowchart illustrating a treatment procedure for a semiconductor wafer W in the heat treatment apparatus 1. The treatment procedure for a semiconductor wafer W, described below, proceeds under control of the controller 3 over each operating mechanism of the heat treatment apparatus 1.

First, the valve 84 for gas supply is opened and the pressure control valve 89 for exhaust is opened to start ventilation in the chamber 6 (step S1). When the valve 84 is opened, nitrogen gas as an inert gas is supplied into the heat treatment space 65 through the gas supply opening 81. In addition, when the pressure control valve 89 is opened, gas in the chamber 6 is discharged through the gas exhaust opening 86. This causes the nitrogen gas supplied from an upper portion of the heat treatment space 65 of the chamber 6 to flow downward to be discharged from a lower portion of the heat treatment space 65.

Figure 9:
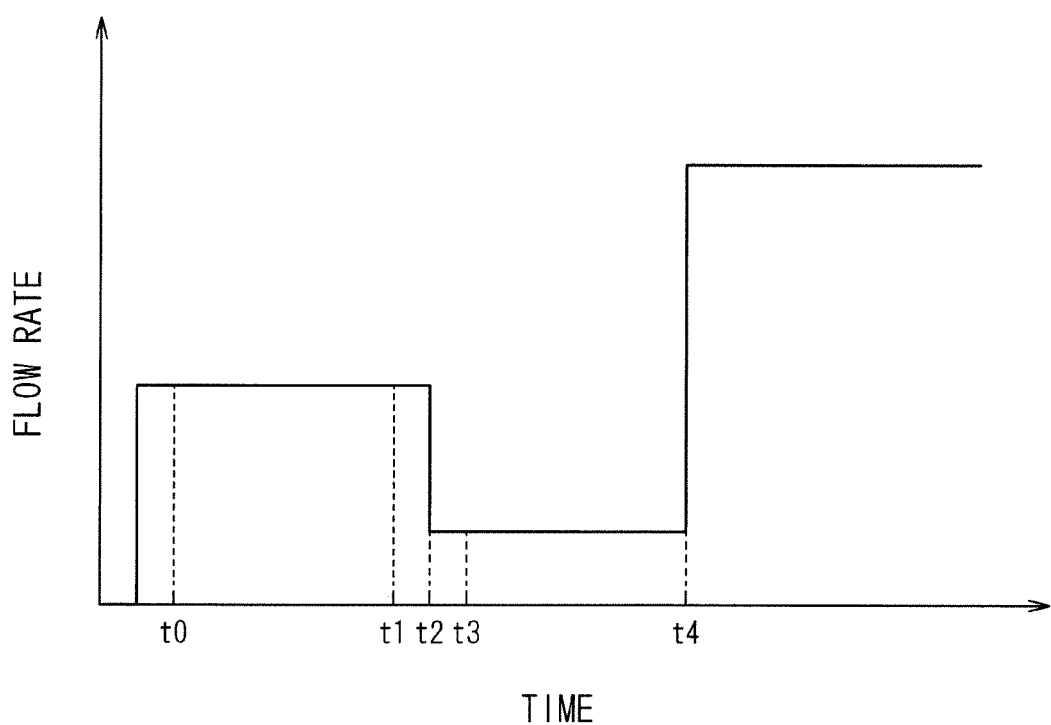
FIG. 9 illustrates a gas supply flow rate into a chamber in a first preferred embodiment.
Figure 10:
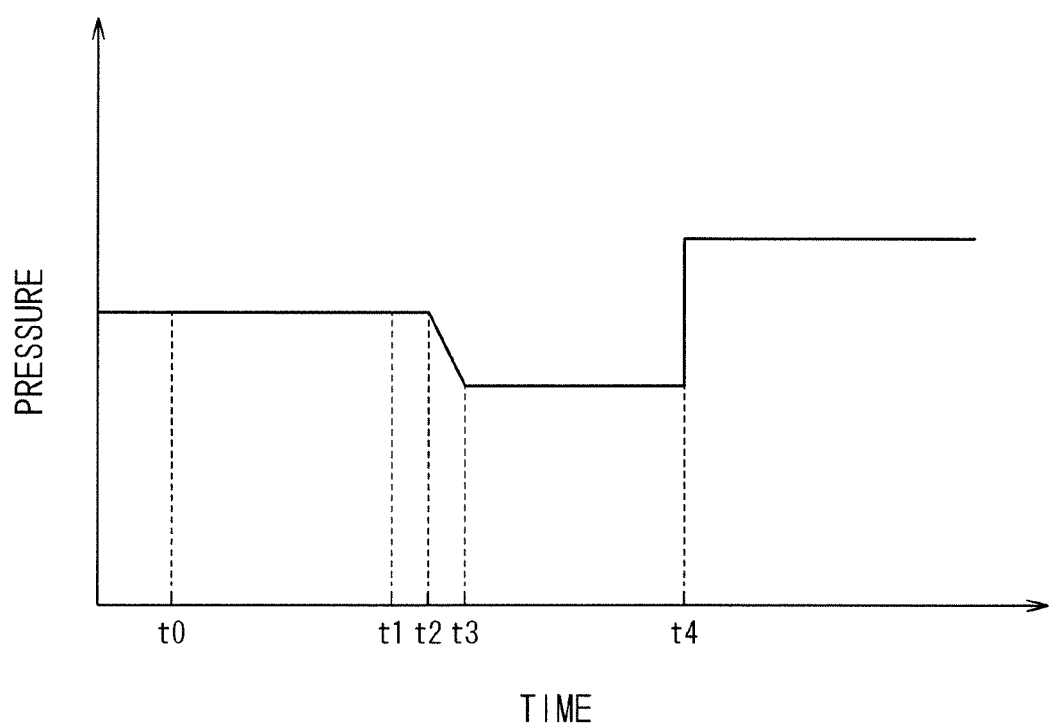
FIG. 10 illustrates pressure change in a chamber in the first preferred embodiment.

FIG. 9 illustrates a gas supply flow rate into the chamber 6 in the first preferred embodiment. FIG. 10 illustrates pressure change in the chamber 6 in the first preferred embodiment. After ventilation in the chamber 6 is started, the gate valve 185 is opened to open the transport opening 66, and then a transport robot outside the heat treatment apparatus 1 transports a semiconductor wafer W, to which impurities have been implanted, into the heat treatment space 65 of the chamber 6 through the transport opening 66 at time t0 (step S2). While at this time, an atmosphere outside the apparatus may be sucked when the semiconductor wafer W is transported, nitrogen gas being continuously supplied into the chamber 6 flows out through the transportation opening 66 to enable reduction in suction of an external atmosphere as much as possible.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the holding plate 75 of the susceptor 74 to receive the semiconductor wafer W. At this time, the lift pins 12 move upward to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downward to transfer the semiconductor wafer W from the transfer mechanism 10 to the susceptor 74 of the holder 7, so that the semiconductor wafer W is held from below in a horizontal posture. The semiconductor wafer W is supported by the substrate support pins 77 provided upright on the holding plate 75, and is held by the susceptor 74. The semiconductor wafer W is held by the holder 7 such that its front surface into which impurities are implanted faces upward. A predetermined distance is defined between the back surface (a main surface opposite to the front surface) of the semiconductor wafer W supported by the substrate support pins 77 and the holding surface 75*a* of the holding plate 75. The pair of transfer arms 11 moved downward below the susceptor 74 is moved back to the retracted position, i.e. to the inside of the recessed portion 62, by the horizontal movement mechanism 13.

After the semiconductor wafer W is held from below by the susceptor 74 made of quartz of the holder 7 in a horizontal posture, the 40 halogen lamps HL of the halogen heating unit 4 light up all together to start preliminary heating (assist heating) (step S3). Halogen light emitted from the halogen lamps HL is transmitted through the lower chamber window 64 and the susceptor 74 both made of quartz, and impinges upon the lower surface of the semiconductor wafer W. When light irradiation from the halogen lamps HL is received, the semiconductor wafer W is preliminarily heated to be increased in temperature. The transfer arms 11 of the transfer mechanism 10 are retracted to the inside of the recessed portion 62, and thus do not obstruct heating using the halogen lamps HL.

The radiation thermometer 120 measures temperature of the semiconductor wafer W when the halogen lamps HL perform the preliminary heating. Specifically, the radiation thermometer 120 receives infrared radiation emitted from the lower surface of the semiconductor wafer W held by the susceptor 74 through the opening 78 to measure temperature of the semiconductor wafer W increasing in temperature. The measured temperature of the semiconductor wafer W is transmitted to the controller 3. The controller 3 controls the output from the halogen lamps HL while monitoring whether or not the temperature of the semiconductor wafer W increasing in temperature by emission of light from the halogen lamps HL reaches a predetermined preliminary heating temperature T1. In other words, the controller 3 effects feedback control of the output from the halogen lamps HL so that the temperature of the semiconductor wafer W is equal to the preliminary heating temperature T1 on the basis of the value measured with the radiation thermometer 120. The preliminary heating temperature T1 is set to a temperature within a range from 200° C. to 800° C., preferably from 350° C. to 600° C., where impurities added to the semiconductor wafer W may not be diffused by heat (600° C. in the present preferred embodiment).

After the temperature of the semiconductor wafer W reaches the preliminary heating temperature T1, the controller 3 maintains the temperature of the semiconductor wafer W at the preliminary heating temperature T1 for a while. Specifically, when the temperature of the semiconductor wafer W measured with the radiation thermometer 120 reaches the preliminary heating temperature T1, the controller 3 controls the output from the halogen lamps HL to maintain the temperature of the semiconductor wafer W at approximately the preliminary heating temperature T1.

When the preliminary heating using the halogen lamps HL as described above is performed, the entire semiconductor wafer W is uniformly increased in temperature to the preliminary heating temperature T1. In the stage of the preliminary heating using the halogen lamps HL, while the semiconductor wafer W shows a tendency to be lower in temperature in a peripheral portion thereof where heat dissipation is liable to occur than in a central portion thereof, the halogen lamps HL in the halogen heating unit 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, so that in-plane temperature distribution of the semiconductor wafer W in the stage of the preliminary heating can be uniform.

Subsequently, the flash lamps FL each irradiate the upper surface of the semiconductor wafer W with a flash of light at time t1 when a predetermined time elapses after temperature of the semiconductor wafer W reaches the preliminary heating temperature T1 (step S4). A part of a flash of light emitted from each of the flash lamps FL directly radiates into the chamber 6, and the other thereof radiates into the chamber 6 after being reflected once by the reflector 52, and then flash heating of the semiconductor wafer W is performed by emission of these flashes of light.

The flash heating is performed by flash irradiation (flash) from each of the flash lamps FL, so that front surface temperature of the semiconductor wafer W can be increased in a short time. In other words, a flash of light emitted from each of the flash lamps FL is an extremely-short and intensive flash acquired by converting electrostatic energy preliminarily accumulated in a capacitor into an extremely short optical pulse of the order of emission time of not less than 0.1 milliseconds and not more than 100 milliseconds. Then, front surface temperature of the semiconductor wafer W irradiated with a flash of light from each of the flash lamps FL for flash heating momentarily increases to a treatment temperature T2 of 1000° C. or more, and rapidly decreases after impurities implanted into the semiconductor wafer W are activated. As described above, the heat treatment apparatus 1 can increase and decrease front surface temperature of the semiconductor wafer W in an extremely short time, so that impurities implanted into the semiconductor wafer W can be activated while diffusion of the impurities is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

The flash lamps FL each emit a flash of light that is an optical pulse with an extremely short emission time and high intensity, so that a structure and a gas in the chamber 6 are rapidly heated to cause instantaneous gas expansion followed by shrinkage. As a result, particles deposited on the lower chamber window 64 and the like curl up and fly into the heat treatment space 65 in the chamber 6. When a flash of light is emitted, the semiconductor wafer W is rapidly thermally expanded to rub on the susceptor 74, thereby causing particles that fly into the heat treatment space 65. During a time period from time t0 at which the semiconductor wafer W is transported into the chamber 6 to time t1 at which a flash of light is emitted, nitrogen gas is supplied into the chamber 6 at a flow rate of 30 liters per minute, and pressure in the chamber 6 is almost atmospheric pressure, or may be positive pressure slightly higher than peripheral atmospheric pressure.

Subsequently, at time t2 immediately after a flash of light is emitted by each of the flash lamps FL, a supply flow rate of nitrogen gas as an inert gas to be supplied into the chamber 6 is reduced to reduce pressure in the chamber 6 (step S5). Specifically, while nitrogen gas is supplied into the chamber 6 by 30 liters per minute when a flash of light is emitted, the supply flow rate is reduced to 10 liters per minute at time t2. The flow regulating valve 80 adjusts a supply flow rate of nitrogen gas into the chamber 6. Exhaust from the chamber 6 is continuously performed. After the supply flow rate of nitrogen gas into the chamber 6 is reduced, pressure in the chamber 6 becomes lower than atmospheric pressure by 0.4 kPa at time t3. Pressure in the chamber 6 is almost atmospheric pressure when the flash lamps FL each emit a flash of light, so that the pressure in the chamber 6 after the flash of light is emitted is reduced to be lower than the pressure when the flash of light is emitted.

After that, during a time period from time t3 to time t4, the pressure in the chamber 6 is maintained at pressure lower than atmospheric pressure by 0.4 kPa (step S6). Thus, pressure in the chamber 6 is maintained at pressure lower than that when the flash of light is emitted. Even during a time period from time t3 to time t4, nitrogen gas is supplied into the chamber 6 at a supply flow rate of 10 liters per minute, and thus the pressure control valve 89 adjusts an exhaust flow rate to maintain pressure in the chamber 6 in a pressure reduction state where the pressure is lower than atmospheric pressure by 0.4 kPa. A time from time t3 to time t4, or a time for maintaining pressure in the chamber 6 lower than that when a flash of light is emitted, is not less than one second and not more than 50 seconds.

During a time period from time t3 to time t4, pressure in the chamber 6 is maintained to be lower than that when a flash of light is emitted so that particles existing in the chamber 6 are less likely to remain in the chamber 6.

Subsequently, a supply flow rate of nitrogen gas into the chamber 6 is increased at time t4 to increase pressure in the chamber 6 to positive pressure higher than peripheral atmospheric pressure (step S7). Specifically, a supply flow rate of nitrogen gas into the chamber 6 is increased from 10 liters per minute to 60 liters per minute at time t4. The chamber 6 has a volume of 30 liters, so that nitrogen gas at a flow rate per minute, twice the volume of the chamber 6, is to be supplied at time t4. Exhaust from the chamber 6 is continuously performed. When a supply flow rate of nitrogen gas into the chamber 6 is suddenly increased, pressure in the chamber 6 increases to positive pressure higher than peripheral atmospheric pressure by 0.2 kPa to 0.6 kPa at time t4. Then, the pressure control valve 89 adjusts an exhaust flow rate so that pressure in the chamber 6 can be maintained in such a way as to maintaining positive pressure after time t4.

When nitrogen gas is supplied into the chamber 6 at a large flow rate per minute, twice the volume of the chamber 6, particles flying in the heat treatment space 65 in the chamber 6, caused by flash irradiation, are quickly swept away to the outside of the chamber 6 by a flow of the nitrogen gas. When the particles are discharged to the outside of the chamber 6, gas in the heat treatment space 65 in the chamber 6 is to be replaced with a clean nitrogen atmosphere.

After the flash lamps FL each emit a flash of light, the halogen lamps HL each are tuned off after elapse of a predetermined time. This causes the semiconductor wafer W to rapidly decrease in temperature from the preliminary heating temperature T1. The radiation thermometer 120 measures the temperature of the semiconductor wafer W decreasing in temperature, and a result of measurement is transmitted to the controller 3. The controller 3 monitors whether the temperature of the semiconductor wafer W is decreased to a predetermined temperature on the basis of the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upward, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (step S8). Then, the heat treatment apparatus 1 completes the heating treatment of the semiconductor wafer W. When the transportation opening 66 is opened and the semiconductor wafer W is transported from the chamber 6, gas in the chamber 6 is replaced with a clean nitrogen atmosphere.

In a manufacturing process of semiconductor devices, treatment is performed by a lot composed of a plurality of (e.g., 25) semiconductor wafers W to be treated under the same treatment conditions, in many cases. The above heat treatment apparatus 1 also performs heat treatment in a unit of lot. In a short time after treatment of a prior lot is finished, the inside of the chamber 6 is in a clean state by being purged with nitrogen gas to cause no particle to fly when the first semiconductor wafer W of a subsequent lot is treated. Then atmosphere temperature in the chamber 6 is also a room temperature. However, particles that have not been discharged from the chamber 6 are deposited on a structure (particularly, the lower chamber window 64) in chamber 6.

When the first semiconductor wafer W of the lot is irradiated with a flash of light, the structure and gas in the chamber 6 are rapidly heated, and then instantaneous gas expansion followed by shrinkage causes particles deposited on the lower chamber window 64 and the like to curl up and fly into the heat treatment space 65 in the chamber 6. The first semiconductor wafer W of the lot immediately after being heated with a flash has a temperature higher than an atmosphere temperature in the chamber 6, so that thermal convection upward from a surface the semiconductor wafer W occurs to cause no particle to be attached to the surface of the first semiconductor wafer W.

However, when the second semiconductor wafer W of the lot is transported into the chamber 6, the second semiconductor wafer W has a room temperature, and thus a gas current so as to flow from atmosphere in the chamber 6 toward a surface of the semiconductor wafer W occurs, so that particles flying in the chamber 6 may be attached to the surface of the semiconductor wafer W. Similar contamination due to attachment of particles as described above may be caused also in the third or later semiconductor wafer W of the lot.

In the first preferred embodiment, after a flash of light is emitted from each of the flash lamps FL, pressure in the chamber 6 is once reduced to pressure lower than that when a flash of light is emitted and is maintained for a while, and then a flow rate of nitrogen gas to be supplied into the chamber 6 is increased to discharge gas in the chamber 6. As a result, when the semiconductor wafer W after flash heating is transported from the chamber 6, particles flying in the chamber 6, due to the flash irradiation, are discharged from the chamber 6. When a subsequent additional semiconductor wafer W is transported into the chamber 6, gas in the chamber 6 is replaced with a clean nitrogen atmosphere, and thus it is possible to prevent particles flying in the chamber 6 from being attached to the semiconductor wafer W. As a result, no particle is attached to the second or later semiconductor wafer W of a lot.

It is also conceivable that even when a flow rate of nitrogen gas to be supplied into the chamber 6 is increased immediately after a flash of light is emitted, to discharge particles flying in the chamber 6, a similar effect can be obtained. However, various structures like the holder 7, the transfer mechanism 10, and the like are disposed in the chamber 6 (refer to FIG. 1), so that a structural factor as described above causes a portion of the chamber 6 where gas is liable to remain. When a flow rate of nitrogen gas to be supplied into the chamber 6 is increased immediately after a flash of light is emitted, a portion of the chamber 6 where gas is liable to remain, as described above, is less likely to be replaced with an additional nitrogen gas. As a result, particles existing in that portion of the chamber 6 may remain in the chamber 6 as it is. In this case, particles remaining in the chamber 6 may attach to a new semiconductor wafer W.

In contrast, like the present preferred embodiment, when pressure in the chamber 6 is once reduced lower than that when a flash of light is emitted and is maintained after a flash of light is emitted, particles existing in the chamber 6 are less likely to remain in the chamber 6. As a result, a portion of chamber 6 where gas is liable to remain can be eliminated. After that, when a flow rate of nitrogen gas to be supplied into the chamber 6 is increased, gas in all portions in the chamber 6 can be smoothly discharged, and thus particles can be prevented from remaining in the chamber 6. As a result, particles flying in the chamber 6 can be reliably prevented from being attached to the additional second and later semiconductor wafers W of the lot.

<Second Preferred Embodiment>

Next, a second preferred embodiment according to the present invention will be described. The heat treatment apparatus 1 according to the second preferred embodiment is identical in configuration with that according to the first preferred embodiment. The treatment procedure for a semiconductor wafer W in the second preferred embodiment is also substantially similar to that according to the first preferred embodiment. The second preferred embodiment is different from the first preferred embodiment in a gas supply flow rate into the chamber 6 and pressure change in the chamber 6.

Figure 11:
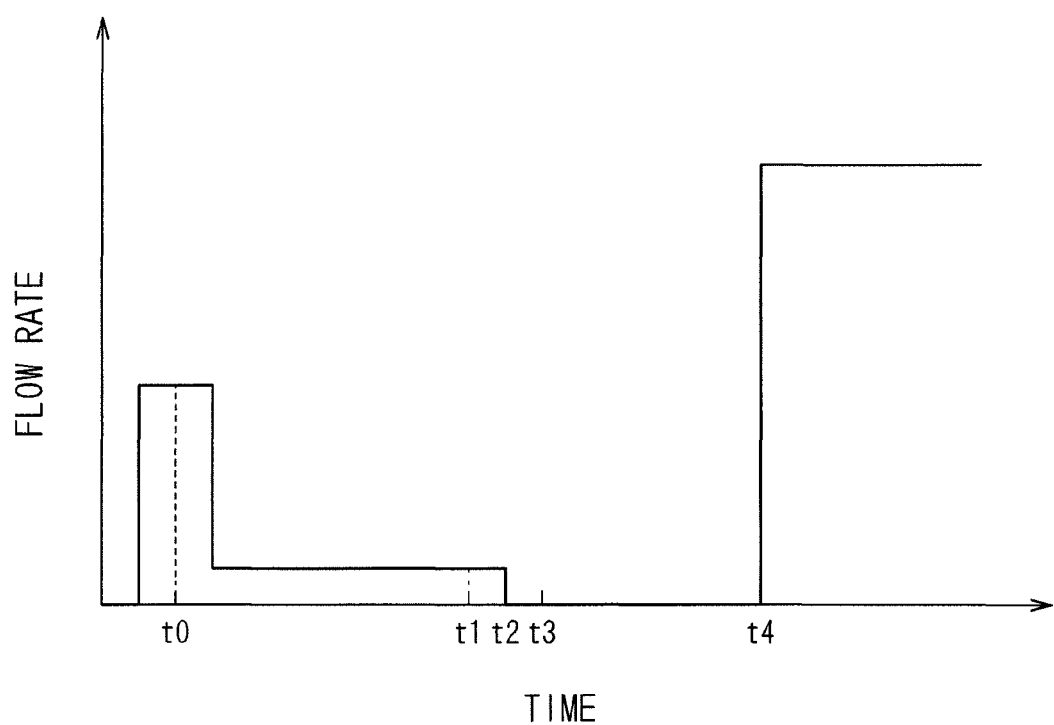
FIG. 11 illustrates a gas supply flow rate into a chamber in a second preferred embodiment.

FIG. 11 illustrates a gas supply flow rate into the chamber 6 in the second preferred embodiment. FIG. 12 illustrates pressure change in the chamber 6 in the second preferred embodiment. As with the first preferred embodiment, after ventilation in the chamber 6 is started, a semiconductor wafer W is transported into the chamber 6 at time t0.

In the second preferred embodiment, after a semiconductor wafer W is transported into the chamber 6 and the gate valve 185 closes the transportation opening 66, a gas supply flow rate into the chamber 6 is reduced to set pressure in the chamber 6 to pressure-reduced atmosphere less than atmospheric pressure. Under the pressure-reduced atmosphere, preliminary heating by the halogen lamps HL is applied to the semiconductor wafer W, and the flash lamps FL each emit a flash of light at time t1. In the second preferred embodiment, a treatment gas containing ammonia may be supplied into the chamber 6 so that flash heating may be applied to the semiconductor wafer W in pressure-reduced atmosphere of ammonia.

At time t2 immediately after a flash of light is emitted, gas supply into the chamber 6 is completely stopped to reduce pressure in the chamber 6 lower than that when a flash of light is emitted. Then, during a time period from time t3 to time t4, gas supply into the chamber 6 is stopped to maintain a state where pressure in the chamber 6 is lower than that when a flash of light is emitted. A time from time t3 to time t4 is not less than one second and not more than 50 seconds.

Then, supply of nitrogen gas into the chamber 6 is started at time t4, and a supply flow rate of the nitrogen gas into the chamber 6 is increased to increase pressure in the chamber 6 to positive pressure higher than peripheral atmospheric pressure. In the second preferred embodiment, a supply flow rate of nitrogen gas into the chamber 6 is also increased to 60 liters per minute at time t4. Thus, nitrogen gas at a flow rate per minute, twice the volume of the chamber 6, is to be supplied at time t4. When a supply flow rate of nitrogen gas into the chamber 6 is suddenly increased, pressure in the chamber 6 increases to positive pressure higher than peripheral atmospheric pressure by 0.2 kPa to 0.6 kPa at time t4. Then, the pressure control valve 89 adjusts an exhaust flow rate so that pressure in the chamber 6 can be maintained after time t4.

When nitrogen gas is supplied into the chamber 6 at a large flow rate per minute, twice the volume of the chamber 6, particles flying in the heat treatment space 65 in the chamber 6, caused by flash irradiation, are quickly swept away to the outside of the chamber 6 by a flow of the nitrogen gas. When the particles are discharged to the outside of the chamber 6, gas in the heat treatment space 65 in the chamber 6 is to be replaced with a clean nitrogen atmosphere.

In the second preferred embodiment, after a flash of light is emitted from each of the flash lamps FL, pressure in the chamber 6 is once reduced to pressure lower than that when the flash of light is emitted and is maintained for a while, and then a flow rate of nitrogen gas to be supplied into the chamber 6 is increased to discharge gas in the chamber 6. As a result, when the semiconductor wafer W after flash heating is transported from the chamber 6, particles flying in the chamber 6, due to the flash irradiation, are discharged from the chamber 6. When a subsequent additional semiconductor wafer W is transported into the chamber 6, gas in the chamber 6 is replaced with a clean nitrogen atmosphere, and thus it is possible to prevent particles flying in the chamber 6 from being attached to the semiconductor wafer W.

<Modifications>

While the preferred embodiments according to the present invention are described above, various modifications of the present invention in addition to those described above may be made without departing from the scope and spirit of the invention. For example, pressure in the chamber 6 is reduced lower than atmospheric pressure by 0.4 kPa after a flash of light is emitted in the first preferred embodiment, but not limited to this, the pressure may be reduced lower than atmospheric pressure by at least 0.4 kPa or more. While decrease in pressure in the chamber 6 after a flash of light is emitted increases effect of causing particles existing in the chamber 6 to be less likely to remain in the chamber 6, a time required for the pressure reduction increases.

During a time period from time t3 to time t4 in which pressure in the chamber 6 after a flash of light is emitted is maintained lower than that when the flash of light is emitted, nitrogen gas is supplied into the chamber 6 at a flow rate of 10 liters per minute in the first preferred embodiment, and gas supply is stopped in the second preferred embodiment, however, a supply flow rate of nitrogen gas during the period of time may be not less than 0 liter per minute and not more than 10 liters per minute.

In addition, a treatment gas supplied into the chamber 6 after a flash of light is emitted is not limited to nitrogen gas, and may be argon or helium. Thus, a treatment gas supplied into the chamber 6 after a flash of light is emitted may be an inert gas.

From a viewpoint of cost of processes, it is preferable to use an inexpensive nitrogen gas.

In each of the preferred embodiments, while nitrogen gas at a flow rate per minute, twice the volume of the chamber 6, is supplied into the chamber 6 at time t4, nitrogen gas at a flow rate per minute, twice or more the volume of the chamber 6 (60 liters per minute or more in the example described above), may be supplied into the chamber 6 at this time.

In addition, in each of the preferred embodiments, while preliminary heating of a semiconductor wafer W is performed by light emission from halogen lamps HL, instead of this, a susceptor holding a semiconductor wafer W may be mounted on a hot plate to preliminarily heat the semiconductor wafer W by heat conduction from the hot plate.

While the 30 flash lamps FL are provided in the flash heating unit 5 in each of the preferred embodiments, the present invention is not limited to this, and any number of flash lamps FL may be provided. The flash lamps FL are not limited to the xenon flash lamps, and may be krypton flash lamps. The number of halogen lamps HL provided in the halogen heating part 4 is also not limited to 40, and any number of halogen lamps HL may be provided.

In each of the preferred embodiments, the filament-type halogen lamps HL each are used as a continuous lighting lamp that emits light continuously for not less than one second to preliminarily heat the semiconductor wafer W, but not limited to this, an arc lamp of a discharge type, such as a xenon arc lamp, may be used as a continuous lighting lamp in place of the halogen lamp HL to preliminarily heat the semiconductor wafer W.

A substrate to be treated by the heat treatment apparatus according to the present invention is not limited to a semiconductor wafer, and may be a glass substrate to be used for a flat panel display such as a liquid crystal display device, or a substrate for a solar battery. The art according to the present invention may be applicable for heat treatment for a high-permittivity gate insulating film (High-k film), joining between metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of heating a substrate by irradiating the substrate with a flash of light, the method comprising the steps of:
   (a) irradiating a surface of a substrate accommodated in a chamber with a flash of light from a flash lamp while supplying an inert gas into said chamber;
   (b) after flash irradiation in said step (a), (b-1) reducing pressure in said chamber to become lower than pressure in said chamber when said step (a) is performed, and (b-2) maintaining the reduced pressure for a period of time after said step (b-1); and
   (c) after said step (b-2), increasing a flow rate of the inert gas to be supplied into said chamber, and discharging a gas in said chamber.

2. The heat treatment method according to claim 1, wherein
   the period of time is not less than one second and not more than 50 seconds.

3. The heat treatment method according to claim 1, wherein
   the inert gas is supplied into said chamber at a flow rate per minute, twice a volume of said chamber, in said step (c).

4. The heat treatment method according to claim 3, wherein
   pressure in said chamber is set to positive pressure higher than atmospheric pressure in said step (c).

* * * * *